US008623242B2

(12) United States Patent
Jiang et al.

(10) Patent No.: US 8,623,242 B2
(45) Date of Patent: Jan. 7, 2014

(54) PARTICULATE NANOPARTICLES AND NANOWIRES OF SILVER AND METHOD FOR LARGE SCALE PRODUCING THE SAME

(75) Inventors: Qingkui Jiang, Jintan (CN); Zhenyu Chang, Jintan (CN); Mingyuan Ge, Jintan (CN); Yonghao Lu, Jintan (CN)

(73) Assignee: Jiangsu Nanowell Advanced Materials Sci & Tech. Co., Ltd., Jiangsu Province (CN)

( * ) Notice: Subject to any disclaimer, the term of this patent is extended or adjusted under 35 U.S.C. 154(b) by 290 days.

(21) Appl. No.: 12/654,138

(22) Filed: Dec. 11, 2009

(65) Prior Publication Data

US 2010/0148132 A1 Jun. 17, 2010

(30) Foreign Application Priority Data

Dec. 11, 2008 (CN) .......................... 2008 1 0163102

(51) Int. Cl.
*H01B 1/02* (2006.01)
(52) U.S. Cl.
USPC ....... 252/514; 204/157.43; 420/501; 977/777
(58) Field of Classification Search
USPC ....... 252/514; 204/157.43; 420/501; 977/777
See application file for complete search history.

(56) References Cited

U.S. PATENT DOCUMENTS

| 2004/0053177 A1* | 3/2004 | Kashiwagi et al. ........... 430/619 |
| 2005/0167640 A1 | 8/2005 | Matsushima et al. |
| 2007/0122932 A1* | 5/2007 | Kodas et al. .................... 438/57 |
| 2007/0178232 A1* | 8/2007 | Kodas et al. .................. 427/180 |
| 2007/0181858 A1 | 8/2007 | Matsushima et al. |
| 2008/0035895 A1 | 2/2008 | Ogi et al. |

OTHER PUBLICATIONS

Murray, et al., Plasmonic Materials, Advanced Materials, Oct. 26, 2007, vol. 19, pp. 3771-3782.
Messer et al., Microchannel networks for nanowire patterning, J. Am. Chem. Soc. 122 (Sep. 29, 2000) vol. 122, pp. 20232-10233.
Peter J. et al. Optical trapping and integration of semiconductor nanowire assemblies in water, Nature Materials, vol. 5, Feb. 2006, pp. 97-101.
Duan X. Et al., General synthesis of compound semiconductor nanowires, Adv. Mater. vol. 12, No. 4 (2000), pp. 298-302.
Seung Joon Lee, et.al. Polarization-dependent surface-enhanced raman scattering from a silver nanoparticle decorated single silver nanowire, Nano Lett. vol. 8 No. 10, (Sep. 4, 2008), 3244-3247.
H.P. Wu, et.al., High conductivity of isotropic conductive adhesives filled with silver nanowires, International Journal of Adhesion & Adhesives vol. 26 (2006) 617-621.
Valentin Valtchev, Silicalite-1 Hollow Spheres and Bodies with a Regular System of Macrocavities,, Chem. Material., vol. 14 (Sep. 21, 2002), 4371-4377.
Y. Gao et.al , Evidence for the Monolayer Assembly of Poly(vinylpyrrolidone) on the Surfaces of Silver Nanowires, J.Phys. Chem.B, vol. 108 (Jul. 9, 2004),12877-12881.
Skrabalak et al., Facile synthesis of Ag nanocubes and Au nanocages, Nature Protocols vol. 2 No. 9 (Sep. 6, 2007), 2182-2190.
Xiong, Y et al, Trimeric clusters of silver in aqueous AgNO3 solutions and their role as nuclei in forming triangular nanoplates of silver., Angewandte Chemie International Edition vol. 46 (May 24, 2007), 4917-4921.
Wiley, B. J.et al, Synthesis and optical properties of silver nanobars and nanorice, Wiley, B. J.et al, Nano Letters vol. 7 No. 4 (Mar. 8, 2007),1032-1036.
Wiley, B et al., Synthesis and Electrical Characterization of Silver Nanobeams. Nano Lett. vol. 6 No. 10 (Sep. 5, 2006), 2273-2278.
Siekkinen, A. R et al., Rapid Synthesis of Small Silver Nanocubes by Mediating Polyol Reduction with a Trace Amount of Sodium Sulfide or Sodium Hydrosulfide. Chem. Phys. Lett. vol. 432(Oct. 27, 2006), 491-496.
Y. Xia. et al., One-Dimensional Nanostructures: Synthesis, Characterization, and Applications. Adv. Mater. vol. 15 No. 5 (Mar. 4, 2003), 353-389.
Washio, Y et al., Reduction by the End Groups of Poly(vinyl pyrrolidone): A New and Versatile Route to the Kinetically Controlled Synthesis of Ag Triangular Nanoplates, Adv. Mater. vol. 18 (2006), 1745-1749.
Jeremy Sloan et.al., Capillarity and silver nanowire formation observed in single walled carbon nanotubes Chem. Commun., (1999),699-700.
Byung Hee Hong et.al, Ultrathin Single-Crystalline Silver Nanowire Arrays Formed in an Ambient Solution Phase, Science, vol. 294 (Oct. 21, 2001), 348-351.
Gou et al. Convenient, Rapid Synthesis of Ag Nanowires, Chem. Mater. vol. 19 No. 7 (Mar. 13, 2007), 1755-1760.

\* cited by examiner

*Primary Examiner* — Douglas McGinty
(74) *Attorney, Agent, or Firm* — Oliff & Berridge, PLC

(57) ABSTRACT

Disclosed is a method suitable for large-scale producing silver nanostructures including nanoparticles and nanowires with high crystallization and purity in a short period of time. In this method, silver particles with mean diameter less than 200 nm and silver nanowires with length in micrometers are produced through a microwave-assisted wet chemistry method. Tens to hundreds grams of silver nanoparticles and nanowires are obtained in minutes by microwave irradiation treatment to a precursor pre-made by highly concentrated silver salt solution and other additives. These silver nanoparticles and nanowires have good dispersibility and are ideal for forming conductive adhesives.

17 Claims, 3 Drawing Sheets

PARTICULATE NANOPARTICLES AND NANOWIRES OF SILVER AND METHOD FOR LARGE SCALE PRODUCING THE SAME

BACKGROUND OF THE INVENTION

1. Field of the Invention

The present invention generally relates to silver nanostructures and a method for producing the same. The invention relates to synthesis of silver nanoparticles and nanowires suitable for large-scale production and use in interconnects of fine circuit pattern, more specifically, and forming conductive adhesives for use in electronic parts, such as electrode of light emitted diode, electrode packing on PCB substrate and packaging materials for integrated circuits.

2. Description of the Prior Art

For fundamental research, when the size of solid reaches nanometer order, the solid's property will be vastly changed due to the small size effect and quantum effect. For metal, especially the noble metal (here we refer to silver (Ag) and gold (Au)), their optical (surface plasma effect) and catalytic properties are mostly dominated by their morphology. Many research works at present are aiming at exploring and utilizing these unique characters[Ref. 1-5], which promotes the manufacturing of silver or gold nanostructures in large scale.

From technique and industrial point of view, silver powders are widely used in electronic industry, especially used to fabricate conductive adhesives. The conductive adhesive is used in electronic parts, such as electrode of light emitted diode, electrode packing on PCB substrate and packaging materials for integrated circuits. The conventional conductive adhesive is produced by mixing conventional adhesive and a conductive power such as carbon, copper, aluminum or silver powder. Silver is known to have higher electronic and thermal conductivity, but be much lower in price than that of other noble metals like gold and platinum. These characters make silver powder a competitive candidate as a filler filled in conductive adhesive. In most cases, high concentration (about 75~85% in weight) of silver particles or flake like silver plates in size from micrometer to sub-micrometer are used to form a conductive pattern in the adhesive to have a low resistivity at the order of $10^{-4}$ ohm-cm. A problem coming with this technique is that such a high concentration of filler will dramatically degrade the properties of adhesive itself, eg. its shear strength, impact strength. To lower the filler concentration meanwhile without compromising its conductivity, therefore, is always a challenge. Dr. Wu.HP[Ref. 6] (in paper "High conductivity of isotropic conductive adhesives filled with silver nanowires" *International Journal of Adhesion & Adhesives* 26 (2006), 617~621) demonstrated a combination of silver particles and nanowires would drastically lower the threshold of filling concentration to reach a high conductivity. An even lower filling concentration could be expected reasonably if only nanowires are used in the adhesives. This brings a challenge on how to produce silver nanowires selectively in a scalable fashion.

Known methods of manufacturing silver nanowire are broadly divided into template-assistant and template-free methods. For template-assistant methods, porous AAO (Anodic Alumina Oxide), carbon nanotube and some "soft-template" like porous $TiO_2$ are widely used as a template that will induce silver to grow into nanowires. The morphology of the nanowires such as diameter and wire length can be controlled when choosing different templates. For template-free methods, silver particles or silver nanowires are produced by reducing it from silver salt at temperature 80~150° C.; morphology of which can be tailored by tuning the amount of surfactant, or adding different reducing agent[Ref. 7-21].

Papers and Patents listed at the end of this section can be viewed as references.

[1] Plasmonic material. W. Andrew Murray and William L. Barnes. Adv. Mater. 19 (2007), 3771

[2] Microchannel networks for nanowire patterning. Benjamin Messer et al., J. Am. Chem. Soc. 122 (2000), 10232

[3] Optical trapping and integration of semiconductor nanowire assemblies in water. Peter J. et al. Nature Materials, 5, 97

[4] General synthesis of compound semiconductor nanowires. X.Duan and C M Lieber. Adv. Mater. 12 (2000), 298

[5] Polarization-dependent surface-enhanced raman scattering from a silver nanoparticle decorated single silver nanowire. Seung Joon Lee, et. al. NanoLett. 8 (2008), 3244

[6] High conductivity of isotropic conductive adhesives filled with silver nanowires. H. P. Wu, et. al. International Journal of Adhesion & Adhesives 26 (2006) 617-621

[7] Silicalite-1 Hollow Spheres and Bodies with a Regular System of Macrocavities, Valentin Valtchev, Chem. Material., 14 (2002), 4376

[8] Evidence for the Monolayer Assembly of Poly(vinylpyrrolidone) on the Surfaces of Silver Nanowires, Y. Gao et. al J.Phys.Chem.B, 108 (2004), 12877

[9] Facile synthesis of Ag nanocubes and Au nanocages, Skrabalak et al, Nature Protocols 2 (2007), 2182

[10] Trimeric clusters of silver in aqueous AgNO3 solutions and their role as nuclei in forming triangular nanoplates of silver., Xiong, Y et al, Angewandte Chemie International Edition 46 (2007), 4917

[11] Synthesis and optical properties of silver nanobars and nanorice. Wiley, B. J. et al, Nano Letters 7 (2007), 1032

[12] Synthesis and Electrical Characterization of Silver Nanobeams. Wiley, B et al. Nano Lett. 6 (2007), 2273

[13] Rapid Synthesis of Small Silver Nanocubes by Mediating Polyol Reduction with a Trace Amount of Sodium Sulfide or Sodium Hydrosulfide. Siekkinen, A. R et al. Chem. Phys. Lett. 432 (2006), 491

[14] One-Dimensional Nanostructures: Synthesis, Characterization, and Applications. Y xia. Et al. Adv. Mater. 15 (2003), 353

[15] Reduction by the End Groups of Poly(vinyl pyrrolidone): A New and Versatile Route to the Kinetically Controlled Synthesis of Ag Triangular Nanoplates. Washio, Y et al. Adv. Mater. 18 (2003), 1745.

[16] Capillarity and silver nanowire formation observed in single walled carbon nanotubes Jeremy Sloan et. al. Chem. Commun., 699 (1999), 700

[17] Ultrathin Single-Crystalline Silver Nanowire Arrays Formed in an Ambient Solution Phase, Byung Hee Hong et. al, Science, 294 (2001), 348

[18] U.S. patent application Ser. No. 11/906,950 filed Oct. 3, 2007.

[19] U.S. patent application Ser. No. 11/045,974 filed Aug. 9, 2007.

[20] U.S. patent application Ser. No. 11/736,036 filed Aug. 9, 2007.

[21] Convenient, Rapid Synthesis of Ag Nanowires et. al, Chem. Mater. 19 (2007), 1755

Silver nanowires obtained by template-assisted method are always impure, since it is hard to retrieve silver from its templates. For example, the silver covered Ag-carbon-nanotube (CNY) composite nanowires, the carbon nanotube functioned as substrate is difficult to remove; and the coverage of silver is incomplete and imperfect at most of times. In addition, the template itself such as AAO has its drawback, which is fragile, small in size and difficult to produce.

On the other hand, template-free method is the widest used method to synthesis silver particles and nanowires in laboratory, where Prof. Xia.YN in the University of Washington had developed it a lot since 1990s, who used a double-inject apparatus that allowed silver salt to be reduced to silver and grow into nanowire simultaneously. Nevertheless, disadvantages of this wet-chemistry method are still obvious, due to its low manufacturing efficiency. Usually, hours to days of time are needed, but only milligrams of outputs will get from the manufacturing procedure. This is also the problem for template-assistant method.

Coprecipitation of silver salt and precipitator is another method to get large volume of silver particle which is a commonly used method in industry. The outputs are plate-like or particle like silver ranging from micrometer to sub-micrometer in size; no nanowire or nanoparticle could be got.

Recently, a microwave-assisted solution method is used as a rapid synthesis to get silver nanowire [21], however, the efficiency is still at a low level, which yields mixture of nanoparticle and wires with only 0.04 kg silver per litre volume of solvent per reaction time in hour.

Therefore, an object of the present invention is to overcome such problems by promoting a method which could produce silver nanowires and nanoparticles with high efficiency. FIG. 1 is a comparison between this patent results and previous reports, in terms of kilograms silver produced per unit of liter*hour. We demonstrate that the disclosed method can produce silver nanostructures selectively and the processing efficiency (Kg/(L*h)) to produce silver is at least one order of magnitude higher than the best published results. Another object is to fabricate a prototype of conductive adhesive utilizing selectively synthesized silver nanowires.

SUMMARY OF THE INVENTION

It is an object of the present invention to produce silver nanoparticle and silver nanowire selectively with a scalable process and with high manufacturing efficiency. Another object of this invention is to provide a prototype of conductive adhesive filled with silver nanowires.

In order to accomplish the aforementioned objects, according to one aspect of the present invention, there is provided a method for producing a silver nanoparticle and silver nanowire, the method comprising the steps of: producing a precursor containing silver ions, surfactant, additive and reducing agent; treat this precursor under microwave irradiation for minutes to get silver nanoparticle or nanowire products when washed under water for several times.

In this method, the precursor is made following the steps of: resolving silver salts and surfactant into reducing agent to get transparent solution; adding some soluble chloride to the solution and stirring it to form a precursor suspension. To get silver nanoparticle or nanowire outputs, it needs to put the suspension under microwave irradiation for minutes; then washing these outputs by water or ethanol for several times; re-dispersing in ethanol or drying them to get the final products. As mentioned, silver salts refer to silver nitrate or silver acetate; surfactant refers to polyvinyl pyrrolidone (PVP), preferable the degree of polymerization K>30; reducing agent refers to glycol, glycerol or their mixture; soluble chloride refers to sodium chloride (NaCl), potassium chloride (KCl), magnesium chloride ($MgCl_2$), Calcium Chloride ($GaCl_2$), zinc chloride ($ZnCl_2$).

According to another aspect of this invention, there is provided a large-scale manufacturing procedure which will generate grams of silver nanoparticles or nanowires or their mixture within 10 minutes, which have a mean diameter of less than 200 nm for nanoparticles and 1~10 μm in length for nanowires by statistic analysis from SEM images. Washing the outputs by water or ethanol can remove additional unnecessary additives and reducing agent, resulting to purified nano silver, which can be well re-dispersed in most organic solvents or dried to powders.

According to a further aspect of the invention, a silver nanowires is provided wherein a conductive adhesive formed by mixing of these nanowires and conventional adhesive in high speed mixer. Silver nanowires in the conductive adhesive have a mean length of 8 μm, normally 5~20 μm is preferable; electronic conductivity is at the order of $10^{-4}$ ohm-cm at filling concentration of about 53%. Silver nanowires can be produced by the above described method for large quantities.

According to the present invention, it is possible to selectively produce silver nanoparticles and silver nanowires having good dispersibility, and the nanowires are capable of forming an adhesive with low filling concentration and high conductivity.

DESCRIPTION OF THE PREFERRED EMBODIMENTS

Figure 1:
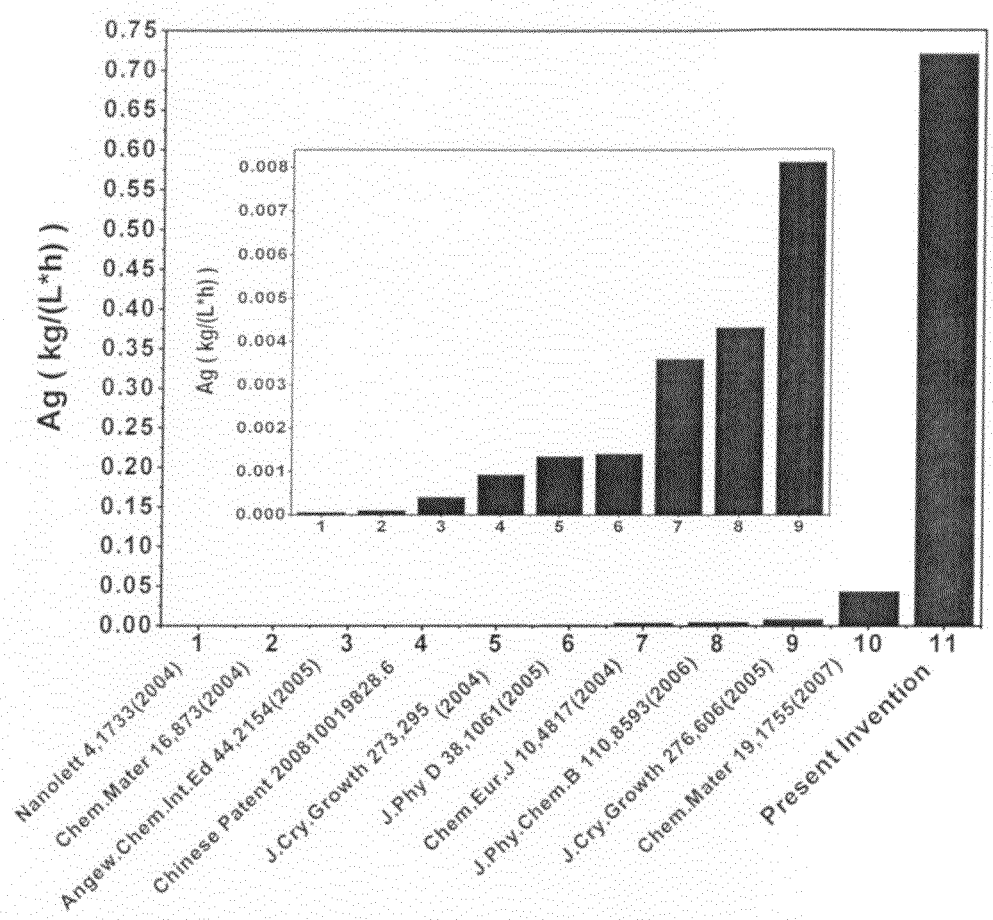
FIG. 1 is the comparison of present invention results and previous reports.
Figure 2:
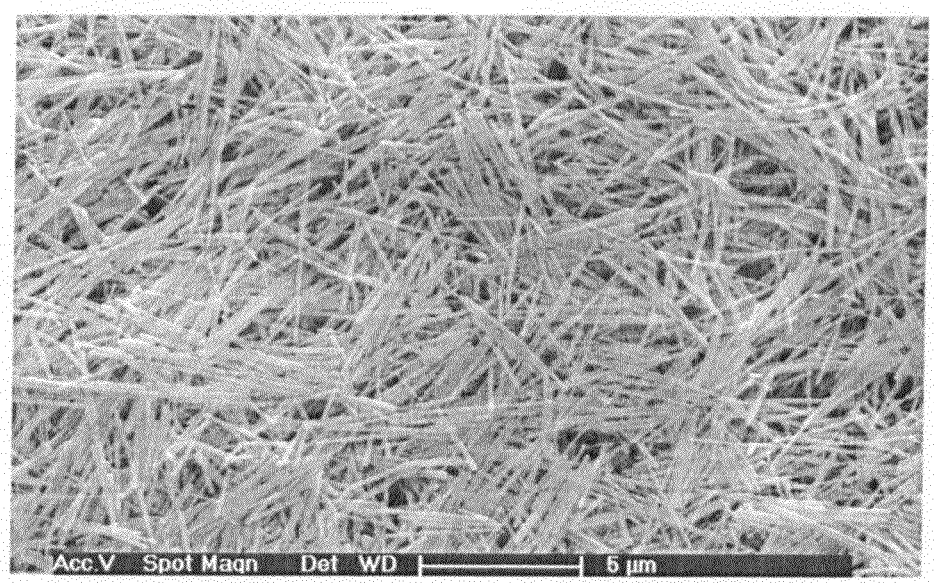
FIG. 2 is Scanning Electronic Microscope (SEM) image of silver nanowires as obtained in Example 1. The sample was made by pasting silver powders on silicon substrate.
Figure 3:
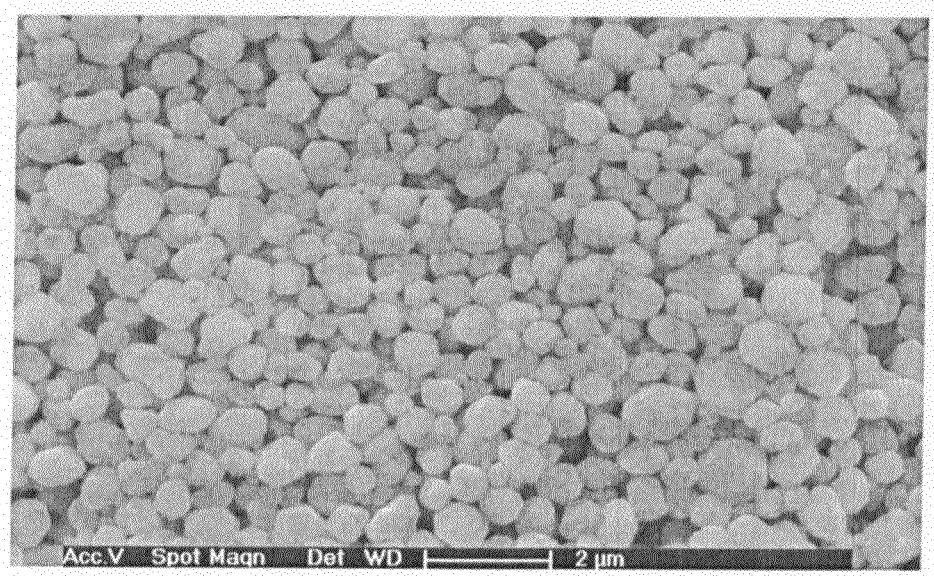
FIG. 3 is Scanning Electronic Microscope (SEM) image of silver nanoparticles as obtained in Example 2. The sample was made by pasting silver powders on silicon substrate.
Figure 4:
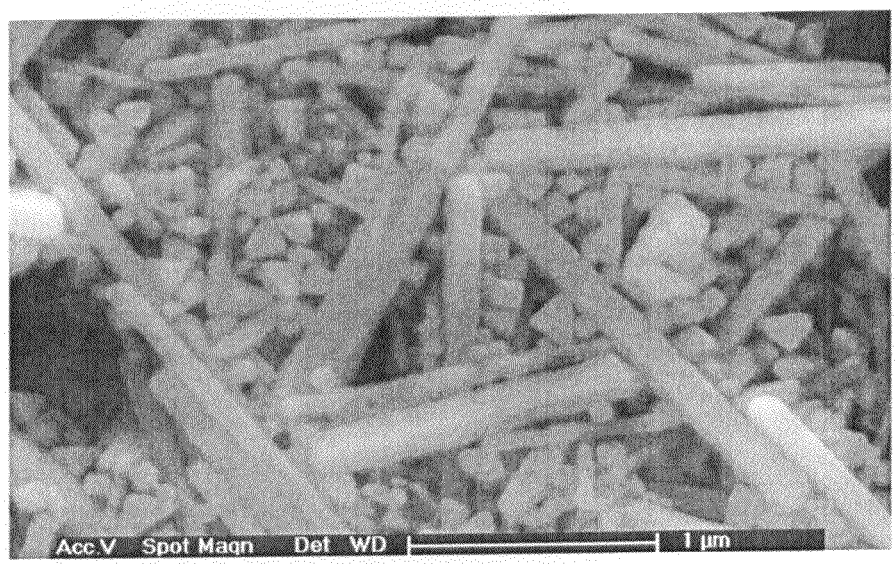
FIG. 4 is Scanning Electronic Microscope (SEM) image of the mixture of silver nanowires and silver nanoparticles as obtained in Comparative Example 1. The sample was made by pasting silver powders on silicon substrate.
Figure 5:
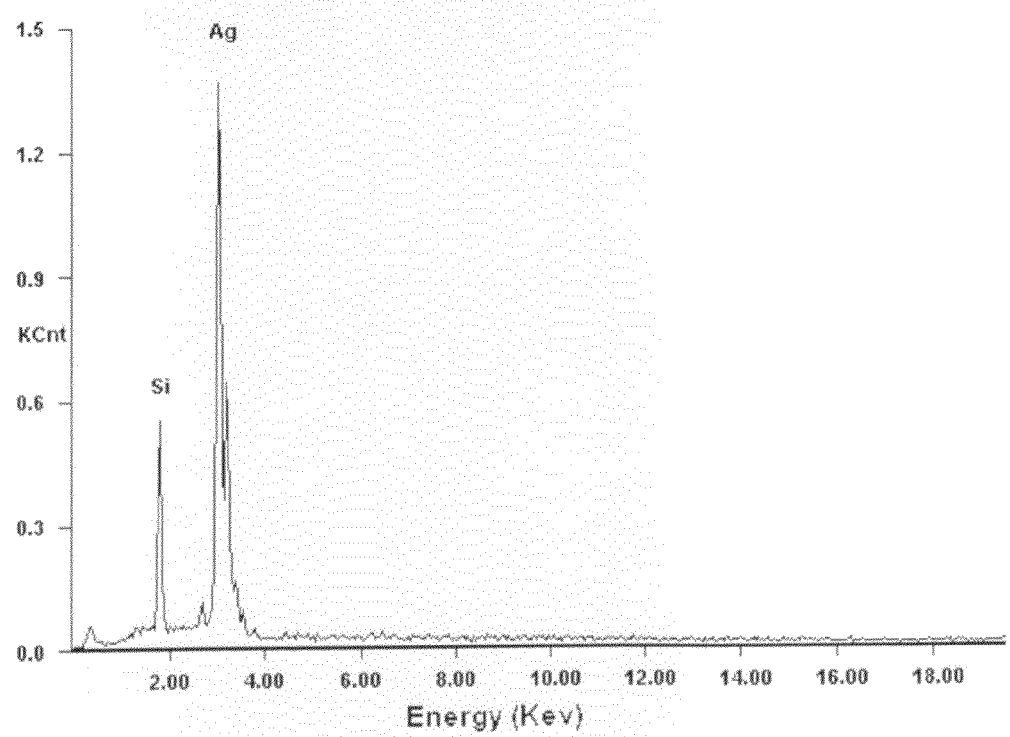
FIG. 5 is the Energy Dispersive Spectrometers data of silver nanowires as obtained in Example 1. The sample was made by pasting silver powders on silicon substrate, therefore, the Si peak came from the substrate.

In a preferred embodiment of a method for producing silver nanoparticles and nanowires in large scale according to the present invention, a mixture powder of silver salt and surfactant is resolve in the reducing agent (also acts as solvent), referable silver nitrate ($AgNO_3$) for silver salt, polyvinyl pyrrolidone (PVP, K>30) for surfactant and glycol for reducing agent, respectively, to get a transparent solution. After then, addictive of soluble chloride is added to the solution in order to control the morphology of silver nanoparticles and nanowires. This is the end of procedure to prepare silver ions contained precursor which is a yellow-white colored suspension. Specifically, ratio between $AgNO_3$ and PVP is critical to control the final morphology of Ag nanostructure, either nanoparticle or nanowire; $AgNO_3$: PVP greater than 1:1 is essential to get pure silver nanoparticle or nanowire, especially in a high concentration reaction system.

This prepared precursor is then transferred to a commercial micro oven, undergoing microwave irradiation at power of 240 W~1200 W for only 5 minutes more or less. Solution's color will change from yellow-white to dark brown to final yellow-gray, standing for the stages changing from Ag+ in precursor to initial Ag crystallized seeds to final Ag nanoparticles or nanowires. The silver containing slurry thus obtained is washed with water, centrifugaled to remove unnecessary solvent and surfactant and finally re-dispersed in organic or water solution or dried to powders.

As examples of silver salt, there are silver nitrate, silver acetate.

As examples of reducing agent, there are glycol, glycerol or their mixture.

As examples of soluble chloride, there are sodium chloride (NaCl), potassium chloride (KCl), magnesium chloride (MgCl$_2$), Calcium Chloride (GaCl$_2$), zinc chloride (ZnCl$_2$).

In a preferred embodiment of a method for producing silver nanowires contained conductive adhesive, 53%~75% of nanowires in mass fraction is added to conventional epoxy resin adhesive and then mixed well in a high speed mixer. The solidified conductive adhesive has an electron resistivity at an order of $10^{-4}$ ohm-cm and thermal conductivity in range of 0.8~2.9 W/mK.

Examples of silver nanoparticles and silver nanowires and a method for producing the same according to the present invention will be described below in detail.

EXAMPLE 1

2 g silver nitrate and 1.5 g polyvinyl pyrrolidone (PVP) were dissolved into 20 ml glycol under strong stirring to form a transparent aqueous solution. To the aqueous silver-PVP-glycol complex solution, 0.02 g sodium chloride (NaCl) was added and uniformly yellow-white precursor suspension was formed after a short period of ultrasonic treatment. Immediately thereafter, the prepared precursor was transferred to a microwave oven, treated with microwave irradiation at condition of 240 W 8 min. Then the silver slurry thus obtained was washed with water, centrifugaled to remove unnecessary solvent and dried to obtain a silver powder. The powder was pure silver nanowires with mean diameter of 210 nm and length of 10 μm by statistically analysis of SEM image.

EXAMPLE 2

2 g silver nitrate and 1.5 g polyvinyl pyrrolidone (PVP) were dissolved into 20 ml glycol under strong stirring to form a transparent aqueous solution. To the aqueous silver-PVP-glycol complex solution without sodium chloride (NaCl) addition was transferred to a microwave oven, treated with microwave irradiation at condition of 240 W 6 min. Then the silver slurry thus obtained was washed with water, centrifugaled to remove unnecessary solvent and dried to obtain a silver powder. The powder was pure silver nanoparticles with mean diameter of 100 nm by statistically analysis of SEM image.

EXAMPLE 3

2 g silver nitrate and 0.05 g polyvinyl pyrrolidone (PVP) were dissolved into 20 ml glycerol under strong stirring to form a transparent aqueous solution. To the aqueous silver-PVP-glycerol complex solution, 0.025 g potassium chloride (KCl) was added and uniformly yellow-white precursor suspension was formed after a short period of ultrasonic treatment. Immediately thereafter, the prepared precursor was transferred to a microwave oven, treated with microwave irradiation at condition of 400 W for 5 min. Then the silver slurry thus obtained was washed with water, centrifugaled to remove unnecessary solvent and dried to obtain a silver powder. The powder was pure silver nanoparticle.

EXAMPLE 4

10 g silver nitrate and 8 g polyvinyl pyrrolidone (PVP) were dissolved into 200 ml glycol-glycerol mixture under strong stirring to form a transparent aqueous solution. To the aqueous silver-PVP-glycerol complex solution, 0.06 g sodium chloride (NaCl) was added and uniformly brown precursor suspension was formed after a short period of ultrasonic treatment. Immediately thereafter, the prepared precursor was transferred to a microwave oven, treated with microwave irradiation at condition of 1200 W 4 min. Then the silver slurry thus obtained was washed with water, centrifugaled to remove unnecessary solvent and dried to obtain a silver powder. The powder was pure silver nanowires.

EXAMPLE 5

1 Kg silver nitrate and 0.7 Kg polyvinyl pyrrolidone (PVP) were dissolved into 10 L glycol under strong stirring to form a transparent aqueous solution. To the aqueous silver-PVP-glycol complex solution, 20 g sodium chloride (NaCl) was added and uniformly brown precursor suspension was formed after a short period of ultrasonic treatment. Immediately thereafter, the prepared precursor was transferred to a microwave oven, treated with microwave irradiation at condition of 1200 W 15 min. Then the silver slurry thus obtained was washed with water, centrifugaled to remove unnecessary solvent and dried to obtain a silver powder. The powder was pure silver nanowires.

COMPARATIVE EXAMPLE 1

Comparative example was designed according to literature [21], which had the same AgNO3/PVP ratio of 1:1.22, while keep other parameter unchanged.

Specifically, 2 g silver nitrate was dissolved into 20 ml glycol-glycerol mixture under strong stirring to form a transparent aqueous solution. To the aqueous silver-PVP-glycerol complex solution, 0.015 g sodium chloride (NaCl) was added and uniformly brown precursor suspension was formed after a short period of ultrasonic treatment. Immediately thereafter, the prepared precursor was transferred to a microwave oven, treated with microwave irradiation at condition of 320 W 5 min. Then the silver slurry thus obtained was washed with water, centrifugaled to remove unnecessary solvent and dried to obtain a silver powder. The powder was the mixture of silver nanoparticles and silver nanowire.

Table 1 is the summation of Example 1~Example 5. In this present work, we find Cl$^-$ (from NaCl or KCl) is essential to produce silver nanowires while only nanoparticles are obtained when Chloride ion is absent; appropriate amount of AgNO$_3$ and PVP is critical in order to get nanowire or nanoparticle selectively.

TABLE 1

|  | AgNO$_3$(g) | PVP(g) | AgNO$_3$/PVP | Solvent Agent(ml) | NaCl or KCl (g) | Morphology | Efficiency (Kg*L$^{-1}$*h$^{-1}$) |
|---|---|---|---|---|---|---|---|
| Example 1 | 2 | 1.5 | 1:0.75 | 20 | 0.02 | wire | 0.75 |
| Example 2 | 2 | 1.5 | 1:0.75 | 20 | 0.00 | particle | 1 |
| Example 3 | 2 | 0.5 | 1:0.25 | 20 | 0.025 | particle | 1.2 |
| Example 4 | 10 | 8 | 1:0.8 | 200 | 0.06 | wire | 0.75 |
| Example 5 | 1000 | 700 | 1:0.7 | 10000 | 20 | wire | 0.4 |
| Comparative Example 1 | 2 | 2.44 | 1:1.22 | 20 | 0.015 | Wire + particle | 1.2 |
| Comparative Example 2* | 0.09 | 0.11 | 1:1.22 | 20 | 0.015 | Wire + particle | 0.045 |

*Comparative example 2 is from literature [21]

Examples of a silver nanowires filled conductive adhesive and a method for producing the same according to the present invention will be described below in detail.

EXAMPLE 6

Silver nanowires as obtained in EXAMPLE 1 were filled into commercial epoxy resin adhesive at weight concentration of 53% and mixed well using high speed mixer. Electronic resistivity was measured by four point probe instrument. Thermal conductivity was measured by commercial thermal conductivity tester.

EXAMPLE 7

Silver nanowires as obtained in EXAMPLE 1 were filled into commercial epoxy resin adhesive at weight concentration of 67% and mixed well using high speed mixer. Electronic resistivity was measured by four point probe instrument. Thermal conductivity was measured by commercial thermal conductivity tester.

EXAMPLE 8

Silver nanowires as obtained in EXAMPLE 1 were filled into commercial epoxy resin adhesive at weight concentration of 75% and mixed well using high speed mixer. Electronic resistivity was measured by four point probe instrument. Thermal conductivity was measured by commercial thermal conductivity tester.

The results in Example 9 through 11 are showed in Table 2.

TABLE 2

|  | Mass percent of Ag | Bulk resistivity (×10$^{-4}$Ωcm) | Thermal conductivity (W/mK) |
|---|---|---|---|
| Example 6 | 53% | 7.8 | 0.87 |
| Example 7 | 67% | 0.8 | 1.18 |
| Example 8 | 75% | 0.2 | 2.92 |
| Comparative Example * | 75% | 9 | 1.07 |

* Comparative example is a commercial conductive adhesive.

What is claimed is:

1. A silver nanowire-containing product solution made according to a method comprising the steps of:
   (1) dissolving silver salts and a surfactant into a reducing agent to obtain a transparent solution, wherein (i) the silver salts have a concentration ranging from 0.05 g/ml to 0.10 g/ml in the transparent solution and (ii) a ratio of surfactant to silver salts based on weight concentration in the transparent solution is less than 1;
   (2) adding soluble chloride to the transparent solution and stirring the transparent solution with the added soluble chloride to form a precursor suspension; and
   (3) heating the precursor suspension with microwave irradiation to form the silver nanowire-containing product solution.

2. The silver nanowire-containing product solution according to claim 1 wherein soluble chloride is selected from the group consisting of potassium chloride (KCl), magnesium chloride (MgCl$_2$), Calcium Chloride (CaCl$_2$), zinc chloride (ZnCl$_2$), and sodium chloride (NaCl).

3. A method for producing silver nanowires comprising the steps of:
   (1) dissolving silver salts and a surfactant into a reducing agent to obtain a transparent solution, wherein (i) the silver salts have a concentration ranging from 0.05 g/ml to 0.10 g/ml in the transparent solution and (ii) a ratio of surfactant to silver salts based on weight concentration in the transparent solution is less than 1;
   (2) adding soluble chloride to the transparent solution and stirring the transparent solution with the added soluble chloride to form a precursor suspension;
   (3) heating the precursor suspension with microwave irradiation to form a product solution containing silver products, wherein the silver products include silver nanowires; and
   (4) washing the silver products with water or ethanol; and
   (5) re-dispersing the silver products in ethanol or drying the silver products to obtain silver nanowires.

4. The method to claim 3 wherein soluble chloride is selected from the group consisting of potassium chloride (KCl), magnesium chloride (MgCl$_2$), Calcium Chloride (CaCl$_2$), zinc chloride (ZnCl$_2$), and sodium chloride (NaCl).

5. The silver nanowire-containing product solution according to claim 1 wherein the silver salt is silver nitrate or silver acetate.

6. The silver nanowire-containing product solution according to claim 1 wherein the surfactant is polyvinyl pyrrolidone (PVP) having a polymerization degree that is K>30.

7. The silver nanowire-containing product solution according to claim 1 wherein the microwave irradiation is provided in a range of 240 W~1200 W.

8. The method according to claim 3 wherein the silver salt is silver nitrate or silver acetate.

9. The method according to claim 3 wherein the surfactant is polyvinyl pyrrolidone (PVP) having a polymerization degree that is K>30.

10. The method according to claim 3 wherein the microwave irradiation is provided in a range of 240 W~1200 W.

11. The silver nanowire-containing product solution of claim 1 wherein a ratio of weight concentration of silver salts to soluble chloride in the transparent solution ranges from 50:1 to 166:1.

12. The silver nanowire-containing product solution of claim 11, wherein the soluble chloride is sodium chloride (NaCl) or potassium chloride (KCl).

13. The method according to claim 3 wherein a ratio of weight concentration of silver salts to soluble chloride in the transparent solution ranges from 50:1 to 166:1.

14. The method according to claim 13, wherein the soluble chloride is sodium chloride (NaCl) or potassium chloride (KCl).

15. The silver nanowire-containing product solution of claim 1 wherein a molar concentration ratio of silver salts to soluble chloride in the transparent solution ranges from 17:1 to 57:1.

16. The method according to claim 3 wherein a molar concentration ratio of silver salts to soluble chloride in the transparent solution ranges from 17:1 to 57:1.

17. The silver nanowire-containing product solution of claim 1 further comprising:
  (4) washing the silver nanowires contained in the silver nanowire-containing product solution with water or ethanol, and
  (5) re-dispersing the silver nanowires in ethanol.

* * * * *